US012347923B2

(12) United States Patent
Roy et al.

(10) Patent No.: US 12,347,923 B2
(45) Date of Patent: Jul. 1, 2025

(54) UNIVERSAL RRU MOUNTING ASSEMBLY

(71) Applicant: Outdoor Wireless Networks LLC, Claremont, NC (US)

(72) Inventors: Dino R. Roy, Saginaw, TX (US); Michael Shawn McFall, Mansfield, TX (US)

(73) Assignee: Outdoor Wireless Networks LLC, Richardson, TX (US)

( * ) Notice: Subject to any disclaimer, the term of this patent is extended or adjusted under 35 U.S.C. 154(b) by 0 days.

(21) Appl. No.: 18/062,849

(22) Filed: Dec. 7, 2022

(65) Prior Publication Data

US 2023/0109222 A1    Apr. 6, 2023

Related U.S. Application Data

(63) Continuation of application No. 17/038,523, filed on Sep. 30, 2020, now Pat. No. 11,527,815, which is a
(Continued)

(51) Int. Cl.
*H01Q 1/24* (2006.01)
*H01Q 1/12* (2006.01)
(Continued)

(52) U.S. Cl.
CPC .......... *H01Q 1/246* (2013.01); *H01Q 1/1228* (2013.01); *H05K 5/0204* (2013.01); *H04W 88/085* (2013.01)

(58) Field of Classification Search
CPC .... H01Q 1/246; H01Q 1/1228; H05K 5/0204; H04W 88/085
See application file for complete search history.

(56) References Cited

U.S. PATENT DOCUMENTS

| 974,681 A | 11/1910 | Manquais |
| 1,722,757 A | 7/1929 | Abraham |

(Continued)

FOREIGN PATENT DOCUMENTS

| EP | 2309832 A1 | 4/2011 | |
| WO | WO-2012094890 A1 * | 7/2012 | ............. F16M 13/02 |

OTHER PUBLICATIONS

"Extended European Search Report corresponding to European Application No. 17763729.5 dated Sep. 26, 2019".
(Continued)

*Primary Examiner* — Kimberly T Wood
(74) *Attorney, Agent, or Firm* — Myers Bigel, P.A.

(57) ABSTRACT

An assembly for mounting one or more RRUs to a mounting structure includes: first and second mounting panels, each of the first and second mounting panels having a main body and a flange that extends generally perpendicularly to the main body, the main body including mounting apertures patterned for mounting of an RRU; a mounting foundation having side edges, each of the side edges having an open-ended slot; mounting members extending from the flanges away from the main body of each of the first and second mounting panels, the mounting members configured to enter the open-ended slots on the mounting foundation and slide therein, and fasteners cooperating with the mounting members to mount the mounting panel to the mounting foundation.

10 Claims, 9 Drawing Sheets

Related U.S. Application Data continuation of application No. 15/439,488, filed on Feb. 22, 2017, now Pat. No. 10,797,380.

(60) Provisional application No. 62/305,295, filed on Mar. 8, 2016.

(51) Int. Cl.
*H05K 5/02* (2006.01)
*H04W 88/08* (2009.01)

(56) References Cited

U.S. PATENT DOCUMENTS

| | | | |
|---|---|---|---|
| 2,846,570 A | 8/1958 | Harling | |
| 2,910,261 A * | 10/1959 | Ward | H01F 27/06 |
| | | | 336/67 |
| 3,977,801 A | 8/1976 | Philip | |
| 4,190,221 A | 2/1980 | Updike | |
| 4,817,907 A | 4/1989 | Cougan | |
| 4,901,971 A | 2/1990 | Connelly | |
| 4,993,670 A | 2/1991 | Tesar | |
| 5,926,151 A | 7/1999 | Hagiwara et al. | |
| 6,135,402 A | 10/2000 | Hatano et al. | |
| 6,550,170 B1 | 4/2003 | Cooper et al. | |
| 7,084,834 B1 * | 8/2006 | Hopkins | H01Q 1/1228 |
| | | | 343/878 |
| 7,106,273 B1 * | 9/2006 | Brunson | H01Q 1/246 |
| | | | 343/890 |
| 8,794,607 B2 | 8/2014 | Sobajima et al. | |
| 8,810,990 B1 | 8/2014 | Miller et al. | |
| 8,979,049 B2 | 3/2015 | Yoshida | |
| 9,167,712 B2 * | 10/2015 | Lv | H02B 1/26 |
| 9,570,801 B2 | 2/2017 | Zhao et al. | |
| 9,642,284 B2 * | 5/2017 | Lv | H05K 5/023 |
| 9,810,369 B2 | 11/2017 | Lilieholm et al. | |
| 10,228,088 B2 | 3/2019 | Ma et al. | |
| 10,390,386 B2 | 8/2019 | Hendrix et al. | |
| 10,476,127 B2 | 11/2019 | Kim et al. | |
| 10,476,138 B2 | 11/2019 | Gonsowski et al. | |
| 2005/0056743 A1 | 3/2005 | Ware et al. | |
| 2010/0038501 A1 | 2/2010 | Oh | |
| 2010/0288897 A1 | 11/2010 | Chih-Kai | |
| 2013/0032130 A1 * | 2/2013 | Jacques | A47J 33/00 |
| | | | 126/30 |
| 2013/0214652 A1 | 8/2013 | Mathewson | |
| 2013/0312363 A1 | 11/2013 | Bedard | |
| 2014/0179244 A1 * | 6/2014 | Colapietro | H01Q 1/246 |
| | | | 455/90.2 |
| 2014/0220903 A1 | 8/2014 | Schulz et al. | |
| 2014/0252185 A1 * | 9/2014 | Lilieholm | H01Q 1/1207 |
| | | | 248/200 |
| 2015/0017937 A1 | 1/2015 | Colapietro et al. | |
| 2015/0136920 A1 | 5/2015 | Hemmervall et al. | |
| 2015/0144758 A1 | 5/2015 | Kolokotronis | |
| 2015/0238013 A1 | 8/2015 | Chih-Hsiung | |
| 2016/0153609 A1 * | 6/2016 | Ortel | A47B 81/06 |
| | | | 211/26 |
| 2016/0261030 A1 | 9/2016 | Kim et al. | |
| 2016/0302078 A1 * | 10/2016 | Sivanandar | H01Q 1/246 |
| 2016/0352042 A1 | 12/2016 | Wankoff et al. | |
| 2016/0352376 A1 * | 12/2016 | Shimizu | H04B 1/03 |
| 2018/0115047 A1 | 4/2018 | Tsukada | |

OTHER PUBLICATIONS

"International Preliminary Report on Patentability corresponding to International Application No. PCT/US2017/018648 mailed Sep. 20, 2018".

"Notification of Transmittal of the International Search Report and the Written Opinion of the International Searching Authority, or the Declaration, for PCT Application No. PCT/US2017/018648, mailing date: Apr. 28, 2017".

* cited by examiner

UNIVERSAL RRU MOUNTING ASSEMBLY

RELATED APPLICATION

The present application is a continuation of and claims priority to U.S. patent application Ser. No. 17/038,523, filed Sep. 30, 2020, now U.S. Pat. No. 11,527,815, which is a continuation of and claims priority to U.S. patent application Ser. No. 15/439,488, filed Feb. 22, 2017, now U.S. Pat. No. 10,797,380, which claims priority from and the benefit of U.S. Provisional Patent Application No. 62/305,295, filed Mar. 8, 2016, the disclosure of which is hereby incorporated herein in its entirety.

FIELD OF THE INVENTION

The present application is directed generally to the mounting of electronic components, and more specifically to the mounting of remote radio units.

Background

With increased demand for more wireless communication, the number of radio and antenna units that a tower traditionally supports has increased and is expected to continue to increase. New towers will need to be designed to support greater numbers of antenna and radio units, while existing towers are retrofitted to support more units, and effort is made to fully utilize space available on the towers.

Often, remote radio units (RRUs) are mounted on legs of antenna towers. In some instances, it may be desirable to mount two RRUs on a single mounting location. It also may be desirable to mount a complimentary module adjacent the RRUs.

SUMMARY

As a first aspect, embodiments of the invention are directed to an assembly for mounting one or more RRUs to a mounting structure, comprising: first and second mounting panels, each of the first and second mounting panels having a main body and a flange that extends generally perpendicularly to the main body, the main body including mounting apertures patterned for mounting of an RRU; a mounting foundation having side edges, each of the side edges having an open-ended slot; mounting members extending from the flanges away from the main body of each of the first and second mounting panels, the mounting members configured to enter the open-ended slots on the mounting foundation and slide therein, and fasteners cooperating with the mounting members to mount the mounting panel to the mounting foundation.

As a second aspect, embodiments of the invention are directed to a method of mounting an RRU on a mounting structure, comprising the steps of: mounting an RRU on a mounting panel, the mounting panel comprising a main body and a flange that extends generally perpendicularly to the main body, the main body including mounting apertures patterned for mounting the RRU, wherein mounting members extend from the flanges away from the main body, and wherein fasteners cooperate with the mounting members; mounting a mounting foundation on a mounting structure, the mounting foundation having side edges, each of the side edges having an open-ended slot; then sliding the mounting members into the open ends of the slots of the mounting foundation; and securing the fasteners on the mounting members to compress the flanges and the mounting foundation, thereby mounting the RRU on the mounting structure.

DETAILED DESCRIPTION

Figure 1:
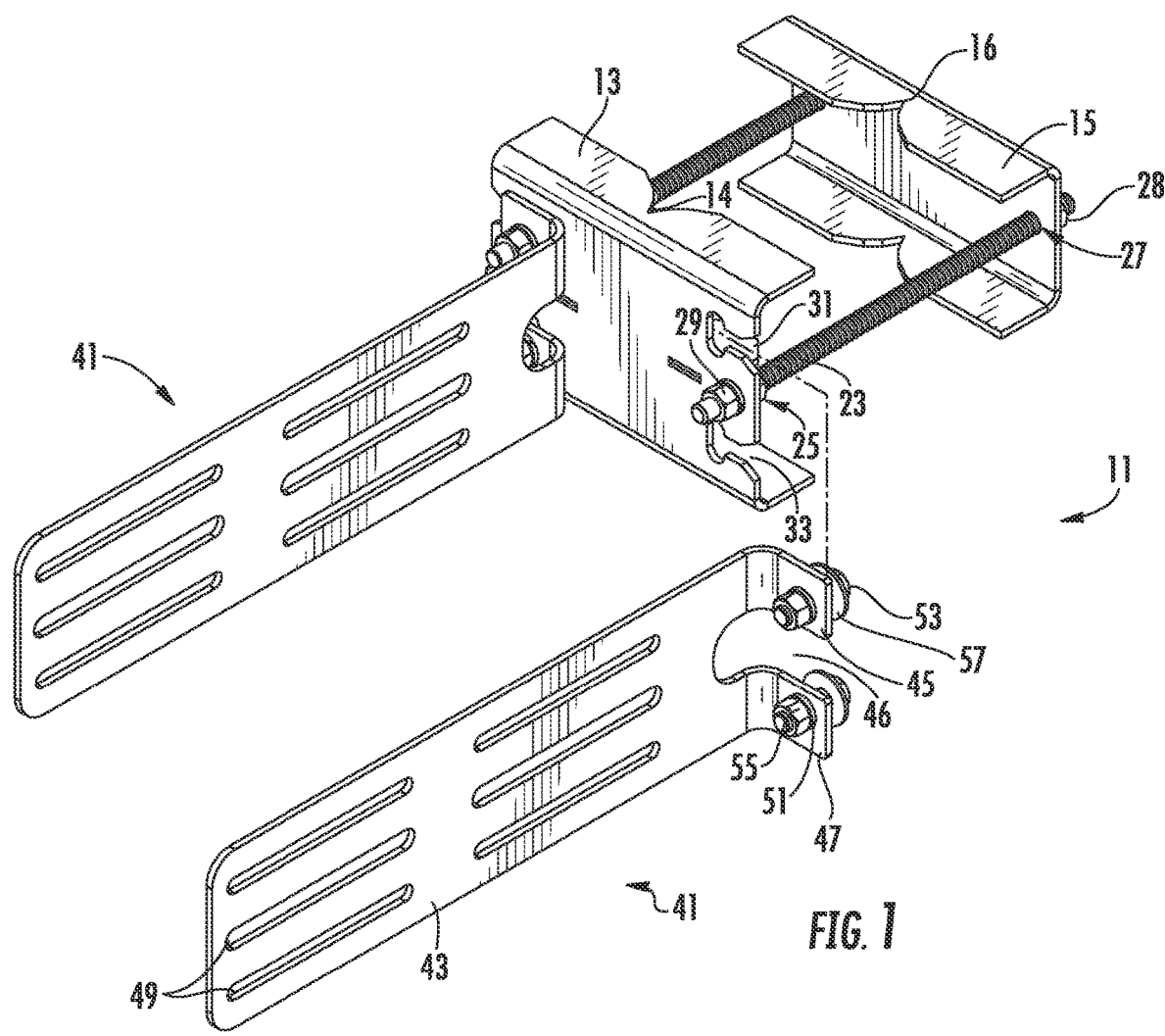
FIG. 1 is a partially exploded perspective view of an RRU mounting assembly according to embodiments of the invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

With reference to the figures, an RRU mounting assembly 11 includes generally U-shaped front and rear pipe clamps 13, 15 (see FIGS. 1-6). The front and rear pipe clamps 13, 15 are held together by two threaded bolts or rods 23 that are inserted through aligned holes 25, 27 located near the edges of the pipe clamps 13, 15 and secured with nuts 28, 29. Tightening of the bolts 23 enables the pipe clamps 13, 15 to clamp the leg of an antenna tower, with the tower leg being held between the recesses 14, 16 in the pipe clamps 13, 15.

Figure 4:
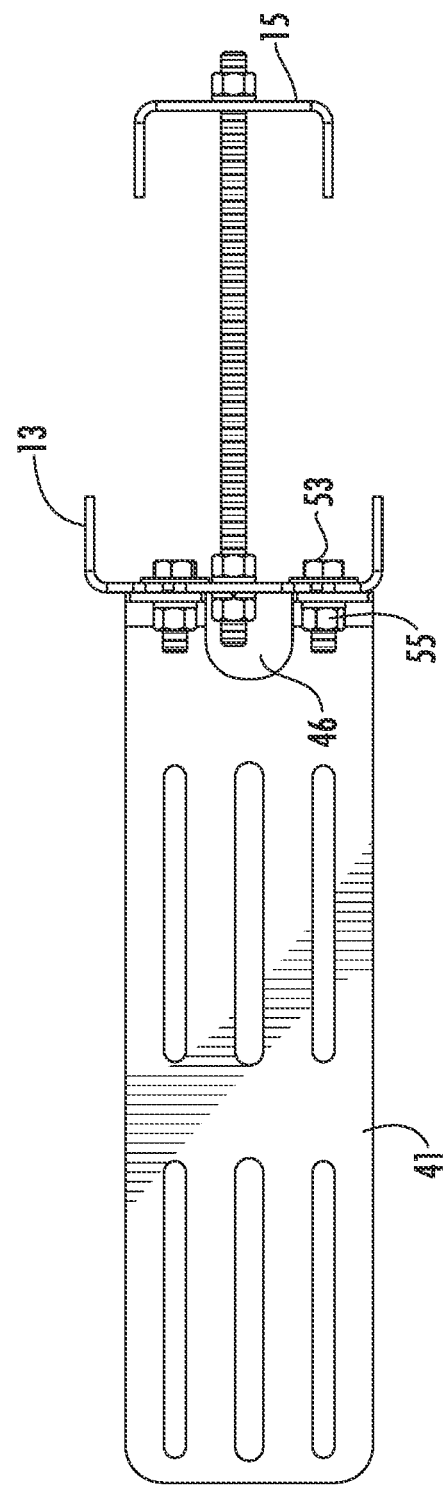
FIG. 4 is a side view of the mounting assemblies of FIG. 2.

It can be seen in FIG. 4 that, in some embodiments, the rear pipe clamp 15 may be shorter than the front pipe clamp 13; for example, the rear pipe clamp may be 4 inches in height, whereas the front clamp may be 6 inches in height. The bolts 23 are typically of sufficient length that the front and rear pipe clamps 13, 15 may clamp around a mounting structure, such as the leg of an antenna tower, that is between about 2 and 20 inches in diameter. Structures other than antenna tower legs, such as antenna frames, antenna pipes, monopoles, street poles, light poles, sector frames, telecommunications racks, and the like, may also serve as suitable mounting structures for the assembly 11.

The front pipe clamp 13 includes two open ended slots 31, 33 on each side edge, with one slot 31 located above the hole 25 and the other slot 33 located below the hole 25. The slots 31, 33 are generally T-shaped.

Referring still to FIG. 1, the RRU mounting assembly 11 includes two L-shaped mounting panels 41, each of which has a main body 43 and two flanges 45, 47 with a gap 46 between the flanges 45, 47. The main body 43 includes three rows of two aligned elongate slots 49, with the rows of slots 49 being separated from each other by about 1.5 inches. Each of the flanges 45, 47 has a hole 51 that receives a bolt 53. The bolt 53 is threaded through an optional washer 57 into a nut 55. The bolts 53 are vertically spaced from each other essentially the same distance as the slots 31, 33 of the front pipe clamp 13.

Figure 2:
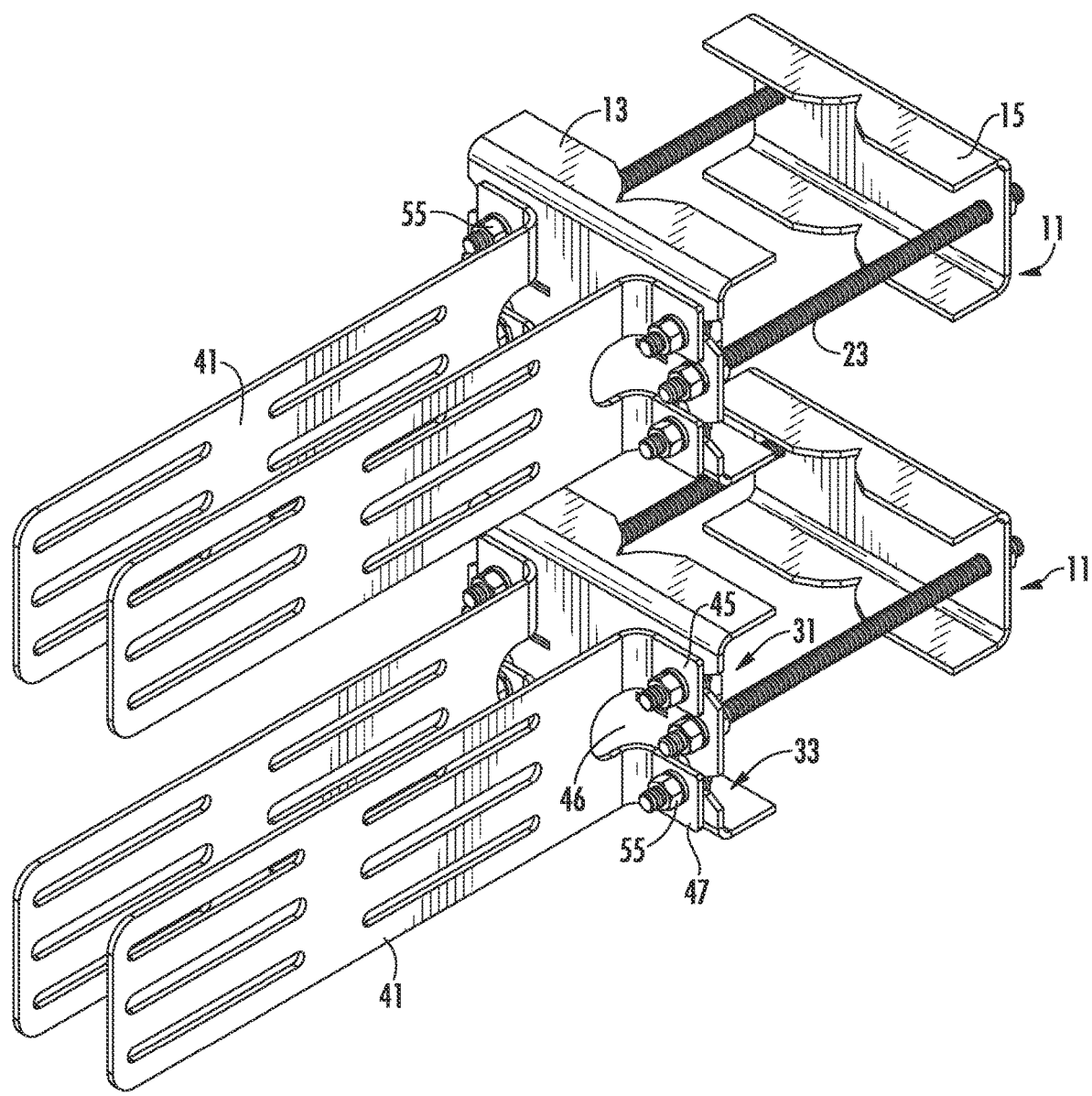
FIG. 2 is a perspective view of two mounting assemblies of FIG. 1.
Figure 3:
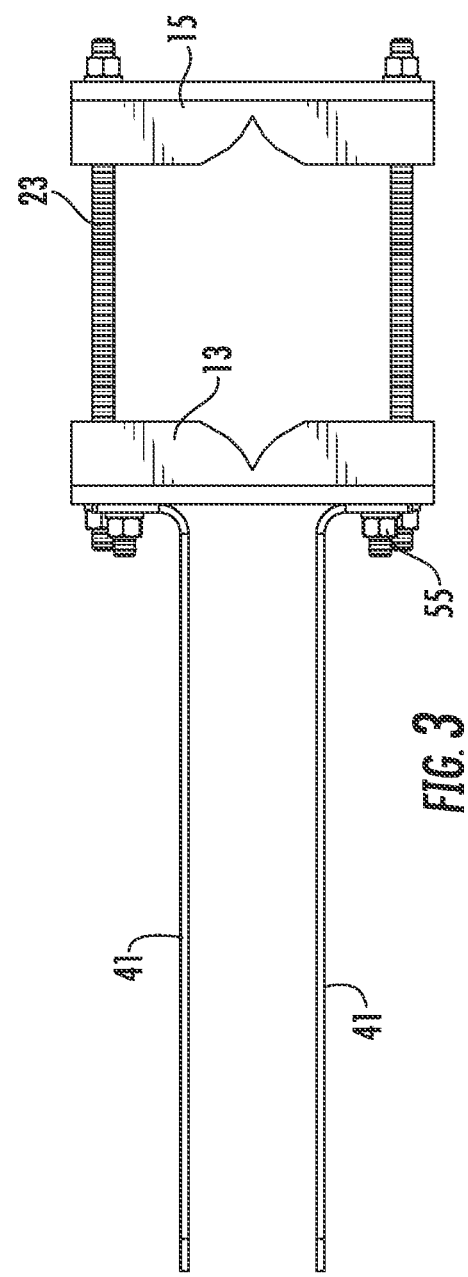
FIG. 3 is a top view of the mounting assemblies of FIG. 2.

As can be seen in FIG. 2, the bolts 53 are threaded into the nuts 55, and the bolts 53 are slid into the open ended slots 31, 33. The T-shape of the slots 31, 33 enables the bolts 53 to slide inwardly, then descend to the lowest ends of the slots 31, 33; the gap 46 prevents the bolts 23 of the pipe clamps 13, 15 from interfering with the sliding action. The nuts 55 can then be tightened to secure the flanges 45, 47 to the front pipe clamp 13.

Figure 5:
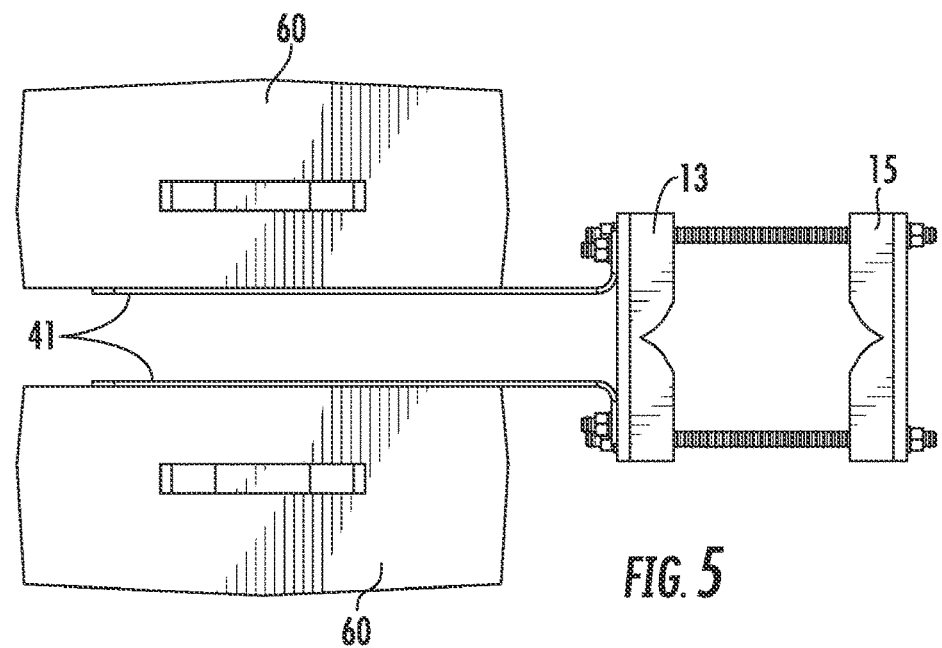
FIG. 5 is a top view of the mounting assemblies as in FIG. 3 with two RRUs mounted thereon.
Figure 6:
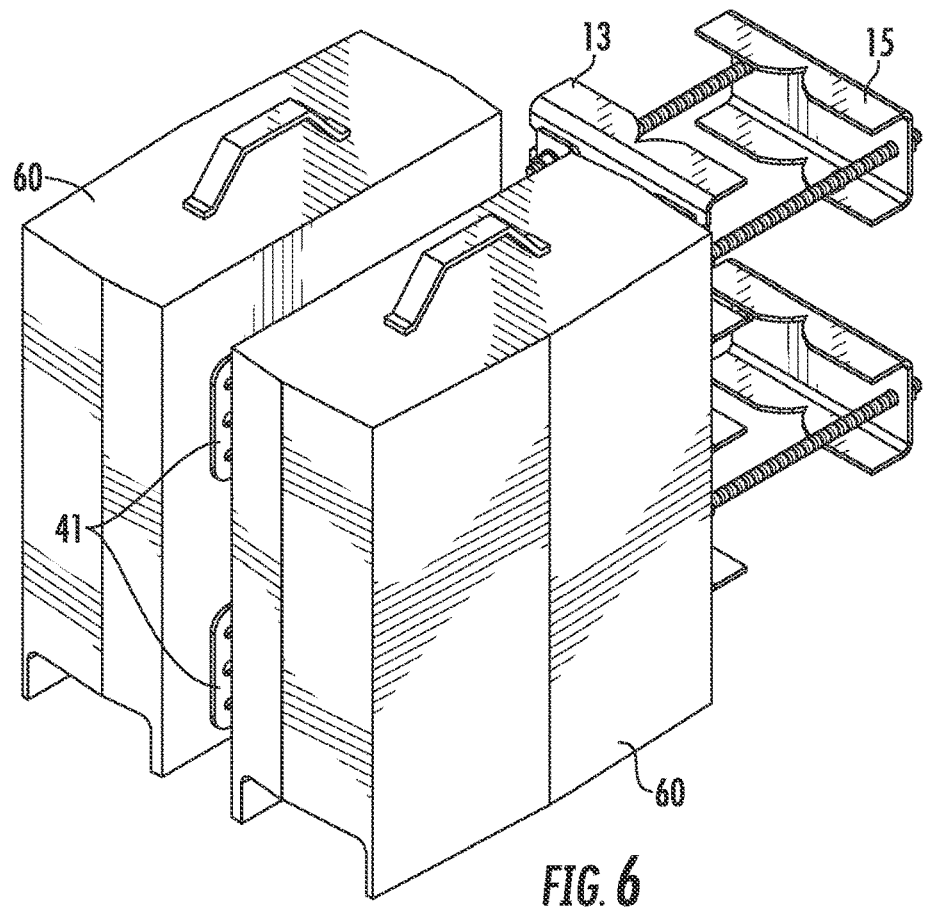
FIG. 6 is a perspective view of the mounting assemblies and RRUs of FIG. 5.
Figure 7:
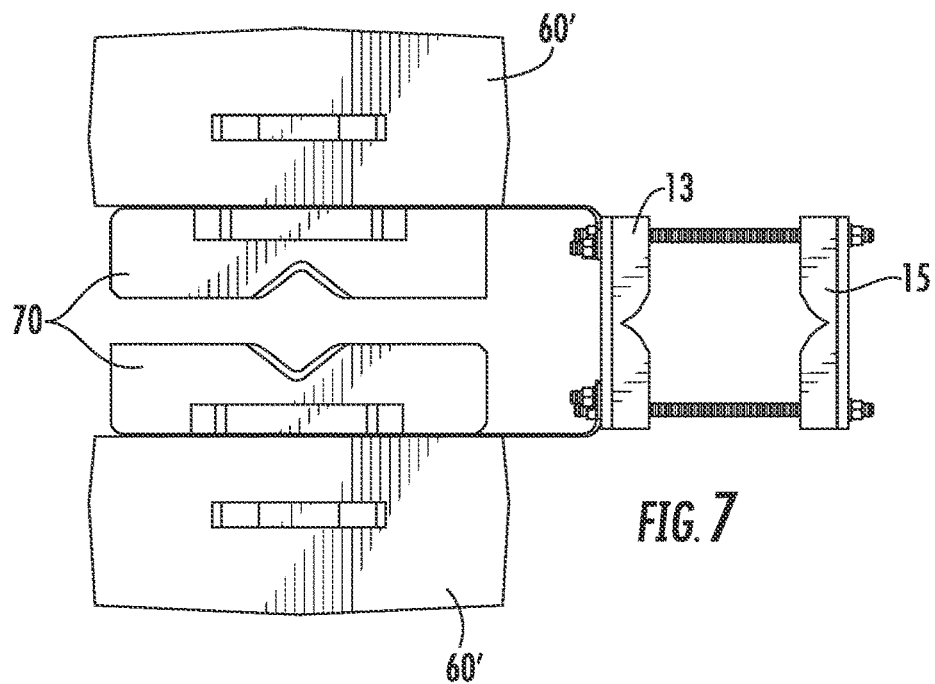
FIG. 7 is a top view of the mounting assemblies of FIG. 2 with the mounting panels oriented with the flanges extending inwardly, and with two RRUs and two A2 modules mounted thereon.
Figure 8:
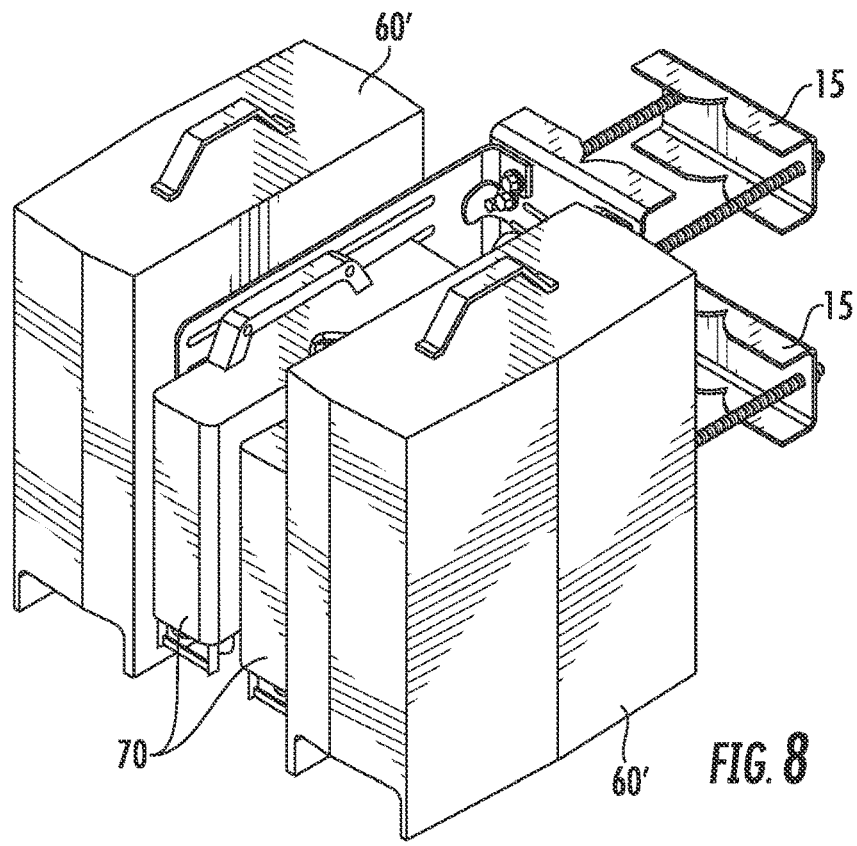
FIG. 8 is a perspective view of the mounting assemblies, RRUs and A2 modules of FIG. 7.

The configuration of the front pipe clamp 13 and the mounting panels 41 enable the mounting panels 41 to be mounted either closely spaced from each other (as shown in FIGS. 2-6) or more distantly spaced from each other (as shown in FIGS. 7 and 8). In each instance, the same process of sliding the threaded bolts 53 with nuts 55 thereon into the slots 31, 33 is followed. If the mounting panels 41 are in the orientation shown in FIGS. 2-6 (i.e., with the flanges 45, 47 extending laterally, so that the flanges 45, 47 of the pair of mounting panels 41 extend away from each other), the mounting panels 41 are closely spaced from one other (typically between about 2 and 3 inches apart). In this orientation, the mounting panels 41 can provide mounting locations for two RRUs 60 in a "back-to-back" configuration, as shown in FIGS. 5 and 6.

If instead the mounting panels 41 are in the orientation shown in FIGS. 7 and 8 (i.e., with the flanges 45, 47 extending inwardly toward the flanges 45, 47 of the other mounting panel 41), the mounting panels 41 are more distantly spaced from each other (i.e., between about 7 and 9 inches apart). In this orientation, the mounting panels 41 can provide mounting locations for two RRUs 60', with one RRU 60' located laterally from each mounting panel 41, and also for two A2 modules 70 sandwiched between the mounting panels 41, with one A2 module 70 mounted to each mounting panel 41, as shown in FIGS. 7 and 8.

It should also be noted that the configuration of the front pipe clamp 13 and the mounting panels 41 can facilitate mounting. In one mounting technique, the mounting panel 41 is first attached to an RRU 60. 60' (and to an A2 module 70, if included) with fasteners (e.g., bolts or screws) inserted through the slots 49, and the nuts 55 can be threaded onto the bolts 53 as they extend through the holes 51. These steps can be completed on the ground. Separately, the front and rear clamps 13, 15 are installed onto a mounting structure, such as the leg of an antenna tower. The RRU 60. 60' and attached mounting panel 41 can then be conveyed up the tower to the mounting location, where the bolts 53 are slid into the open ends of the slots 31, 33 of the front pipe clamp 13 and to the lowest ends of the slots 31, 33. The nuts 55 can then be tightened on the bolts 53 to secure the mounting panel 41 (and in turn the RRU 60, 60') to the front pipe clamp 13. This technique reduces the degree to which the technician has to support and maneuver the RRU 60. 60' while positioned on the tower well above the ground.

Those skilled in this art will appreciate that the configuration of the mounting assembly 11 can vary. For example, in some embodiments the slots 31, 33 of the front pipe clamp 13 may be straight, arcuate, or even L-shaped rather than T-shaped. The front pipe clamp 13 may be mounted to the antenna tower or other mounting structure in a different manner or, on some embodiments, a component other than a front pipe clamp may serve as a mounting foundation.

In other embodiments, the configuration of the mounting panels 41 may vary. Additional flanges may be included, and/or the gap 46 may be omitted so that only a single large flange is present. The slots 49 in the main body 43 of the mounting panel 41 may be apertures of a different configuration and/or pattern, or may be omitted altogether, with another technique for mounting an RRU to the mounting panel (such as hooks stamped from the main body) used.

Further, in some embodiments the bolts 53 may be replaced as mounting members; For example, rather than using a separate and distinct component, such as a bolt, a threaded post may be fixed to and extend from each flange. It can also be envisioned that other varieties of fasteners (e.g., clamps and the like) may be employed to secure the bolts or other mounting members to the front pipe clamp.

Figure 9:
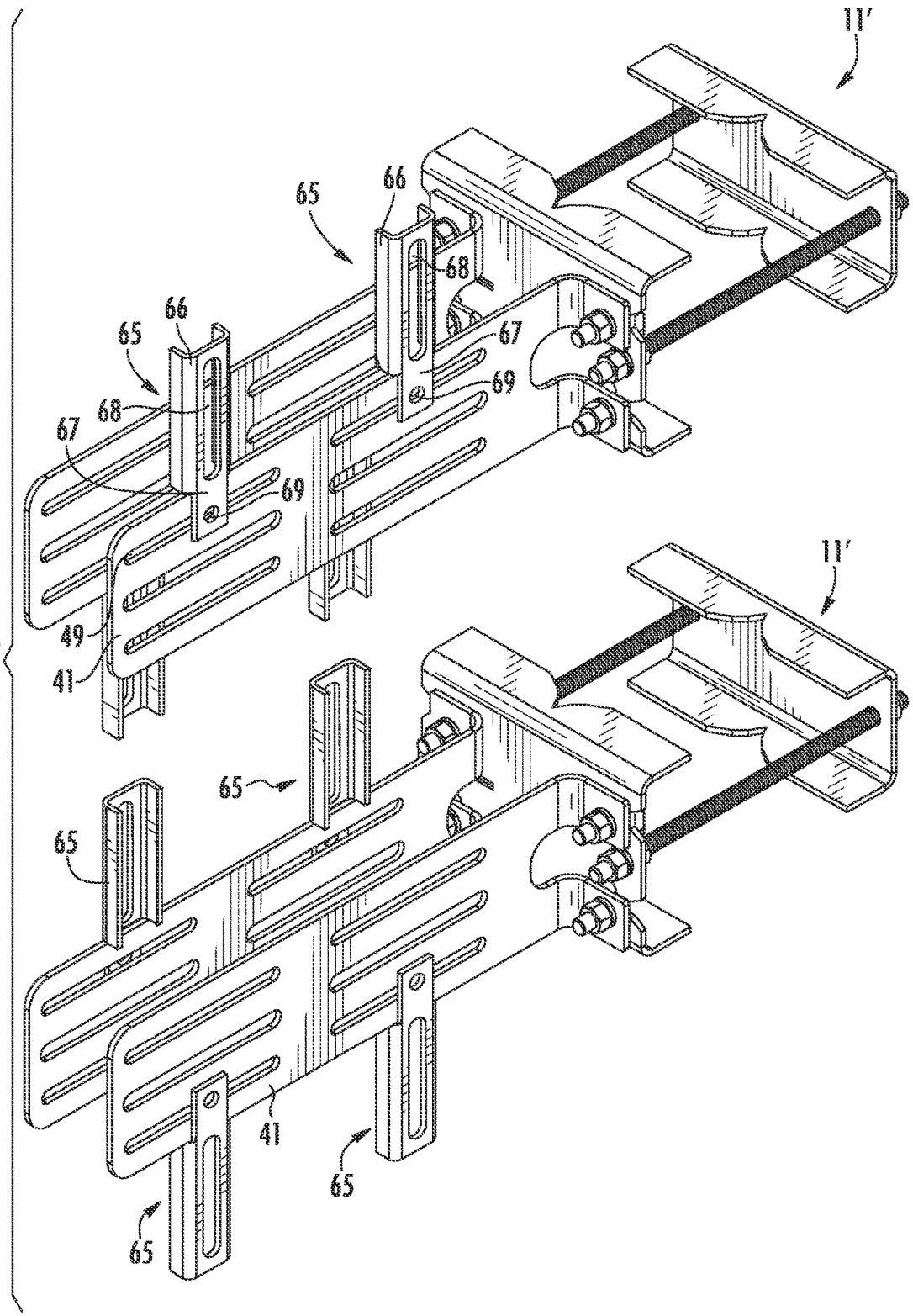
FIG. 9 is a perspective view of two RRU mounting assemblies according to additional embodiments of the invention.

In some embodiments, additional components may be mounted to the mounting panels 41 to provide the technician with more flexibility in mounting the RRUs and/or A2 modules. FIG. 9 shows two mounting assemblies 11' that include mounting extensions 65 mounted to the mounting panels 41. Each mounting extension 65 has a C-shaped channel 66 and a mounting finger 67. A slot 68 is located in the base of the channel 66. As can be envisioned from examination of FIG. 9, the mounting extensions 65 are mounted to the mounting panels 41 via a bolt inserted through a hole 69 in the finger 67 and through one of the slots 49 in the mounting panel 41. The presence of the slot 49 enables the mounting extensions 65 to be mounted in a variety of "fore-and-aft" positions relative to the pipe clamps 13, 15.

FIG. 9 illustrates that the mounting extensions 65 may be mounted with the channels 66 extending upwardly or downwardly (both configurations are shown on the assemblies 11' depicted in FIG. 9). As a result, RRUs of considerably different sizes can be mounted on the same pair of assemblies 11'. Notably, the edges of the channels 66 rest against an upper or lower edge of the mounting panel 41, thereby providing stability to the mounting of the mounting extensions 65.

Figure 10:
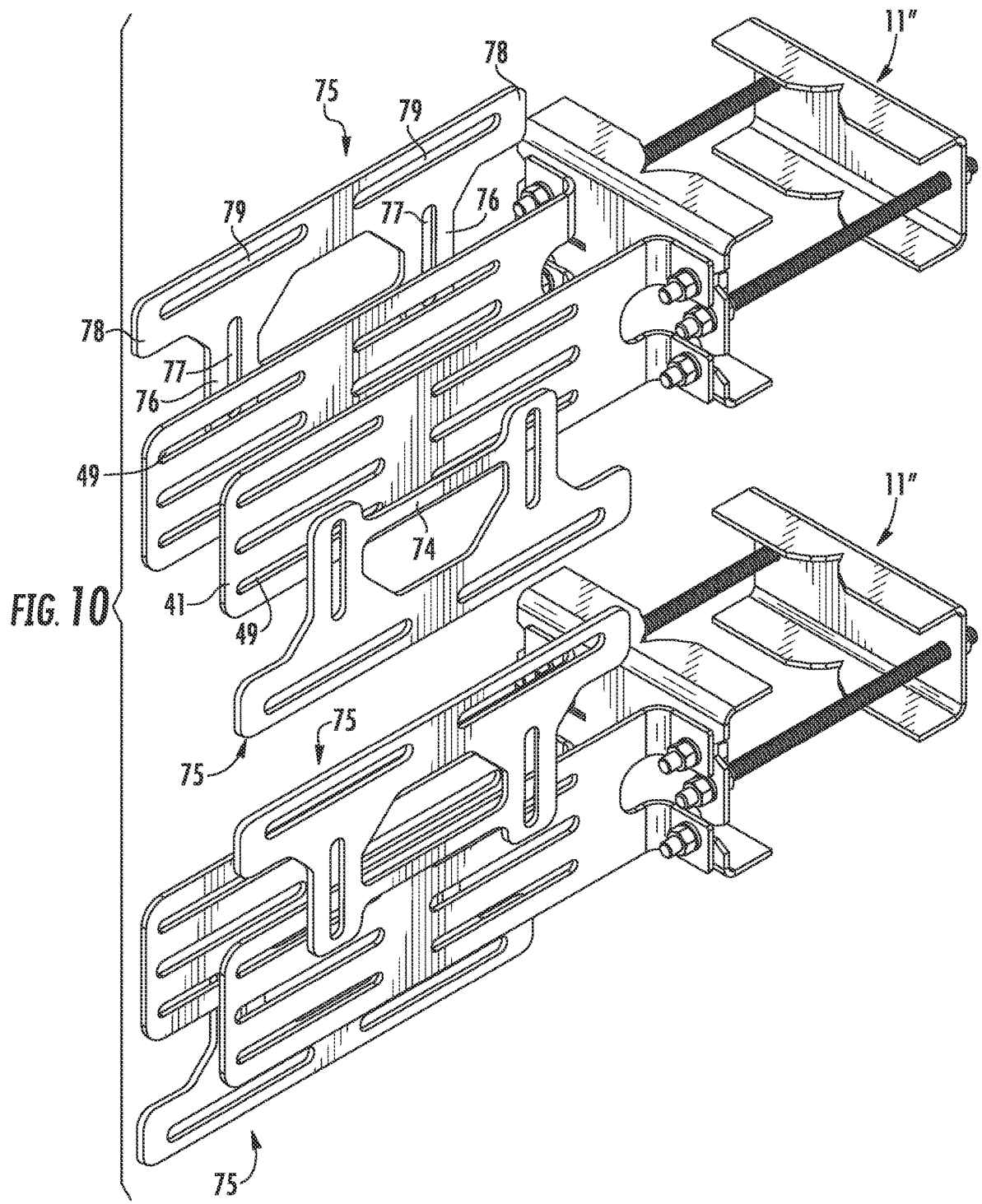
FIG. 10 is a perspective view of two RRU mounting assemblies according to further embodiments of the invention.

A different variety of mounting extension is illustrated in FIG. 10 and designated broadly at 75. The mounting extension 75 is generally planar and has a double "T-shaped" configuration, with each "T" of the mounting extension 75 including a slot 77 in the "stalk" 76 of the "T" and a slot 79 in the "crown" 78 of the "T". The crowns 78 of the "T"s merge at one edge. A brace 74 extends between the stalks 76 of the "T"s. The mounting extensions 75 are mounted to the mounting panels 41 with bolts inserted through the slots 77 and through the slots 49 of the mounting panels 41. The slots 79 provide mounting locations for RRUs. As with the mounting extensions 65, the mounting extensions 75 can be mounted with the crowns 78 above or below the mounting panels 41 to provide mounting locations for a wide variety of different sizes of RRUs and A2 modules.

It should be noted that both the mounting extensions 65 and the mounting extensions 75 may be employed with the flanges 45, 47 of the mounting panels 41 extending outwardly (as shown in FIG. 10) or inwardly (as shown in assembly 11 in FIGS. 2-6) to provide additional mounting options.

Figure 11:
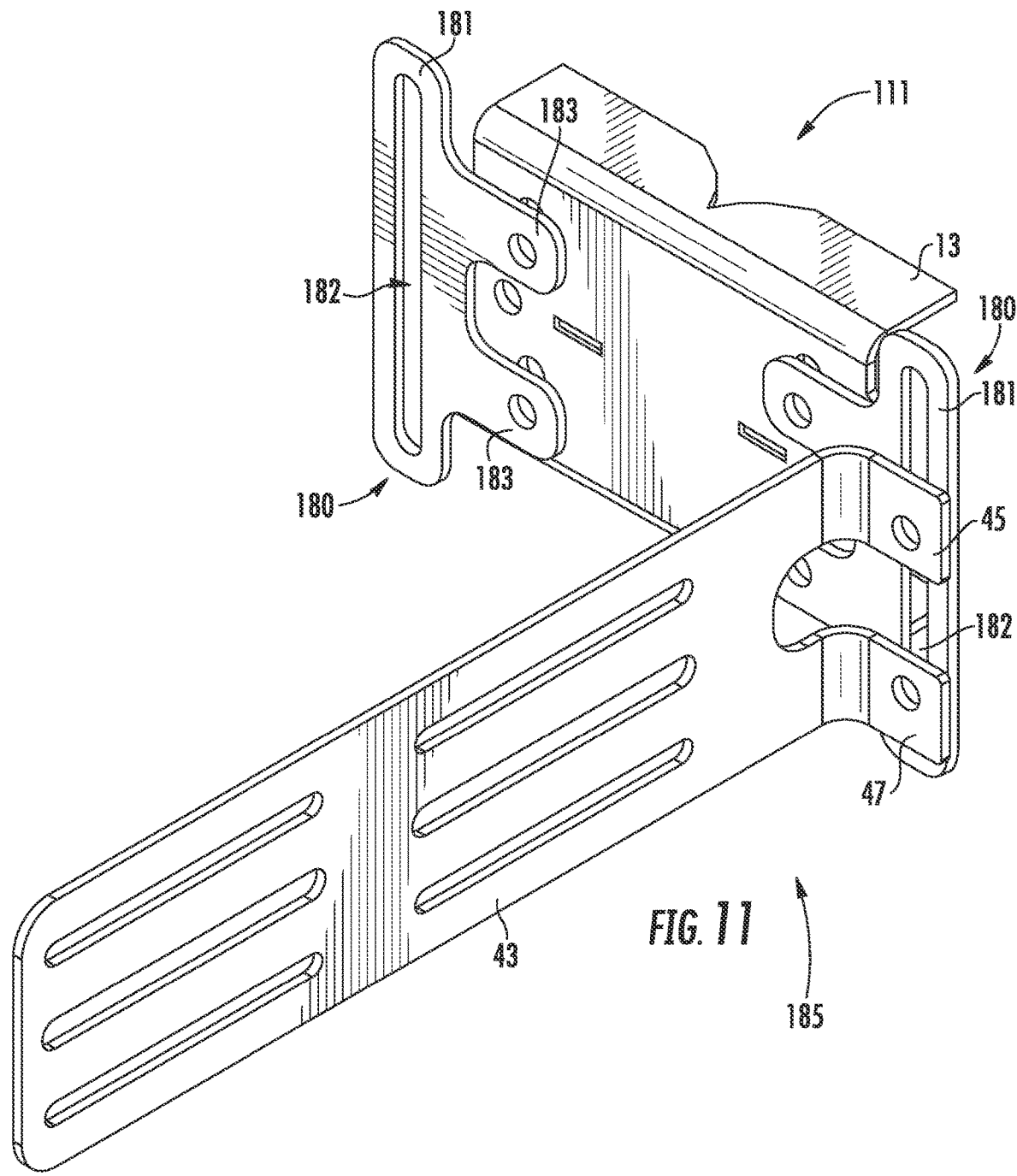
FIG. 11 is a perspective view of a portion of an RRU mounting assembly according to still further embodiments of the invention, with the mounting panels oriented with the flanges extending outwardly.

Referring now to FIG. 11, another RRU mounting assembly, designated broadly at 111, is shown therein. The assembly 111 includes pipe clamps 13, 15 (only the pipe clamp 13 is shown in FIG. 11) and a body 43 and flanges 45, 47 as shown in FIGS. 1-10. However, in this embodiment the mounting panel 185 is a multi-piece unit that includes two flat mounting brackets 180. The mounting brackets 180 have a slotted portion 181 with a vertical slot 182 and two flanges 183 extending generally parallel to each other and perpendicularly to the slot 182. The flanges 183 are mounted to the pipe clamp 13 in the same manner discussed above for the flanges 45, 47 of mounting panels 41 of FIGS. 1-10: i.e., bolts (not shown in FIG. 11) are inserted into slots in the clamp 13 and threaded onto nuts (also not shown in FIG. 11). The remainder of the multi-piece mounting panels 185 can then be attached to the mounting brackets 180 via bolts (not shown) inserted into through the flanges 45, 47 and the slots 182 of the slotted portions 181 of the mounting brackets 180. This configuration can enable the assembly 111 to accommodate wider A2 modules and/or to space RRUs farther apart if desired, and can allow the bodies 43 of the mounting panels 185 to be mounted at different elevations relative to the pipe clamp 13. As with the previously described assemblies, the mounting panels 185 can be mounted with the flanges 45, 47 extending outwardly (as shown in FIG. 11) or inwardly.

Figure 12:
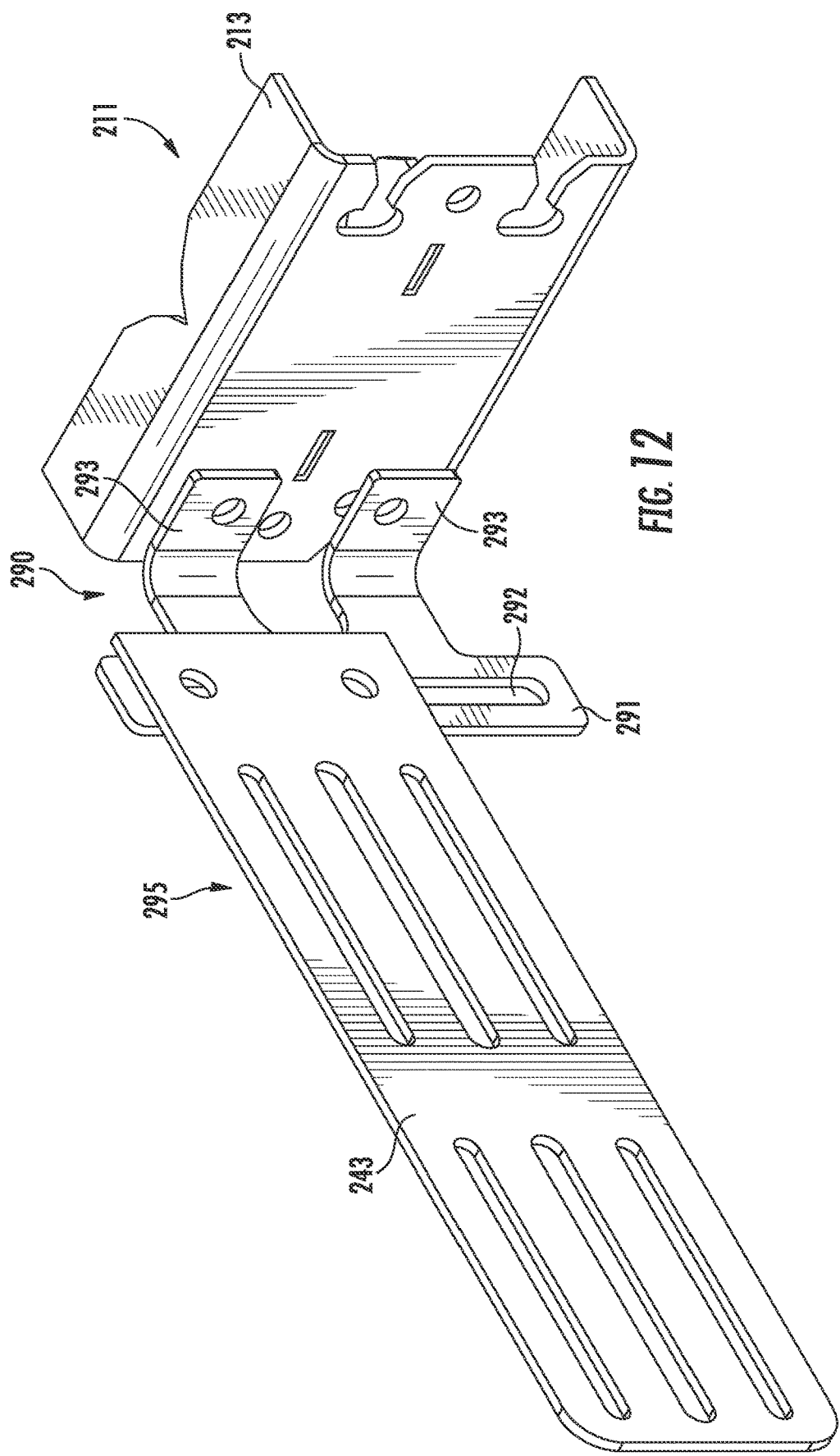
FIG. 12 is a perspective view of a portion of an RRU mounting assembly according to yet further embodiments of the invention.

Referring now to FIG. 12, an assembly 211 shown therein includes two pipe clamps (only pipe clamp 13 is shown in FIG. 12), but includes a multi-piece mounting panel 295 of a different configuration. The body 243 is a flat panel that lacks integral flanges. Instead, the body 243 is mounted to an angled mounting bracket 290 that is somewhat similar to the clamp extension 180 described above, but with fingers that are bent at a generally right angle to form mounting flanges 293. Thus, the body 243 and the angled mounting bracket 290 together form a multi-piece flanged mounting panel 295. The flanges 293 mount to the pipe clamp 13 as described above, but the body 243 mounts to the mounting bracket 290 via bolts (not shown) inserted through holes 251 in the body 243 and through slots 292 of the slotted portion 291 of the mounting bracket 290. This configuration can enable the assembly 111 to accommodate wider A2 modules and/or to space RRUs farther apart if desired, and can allow the bodies 243 to be mounted at different elevations relative to the pipe clamp 13. The mounting brackets 290 can also be mounted with the ends of the flanges 293 extending inwardly (as shown in FIG. 12) or outwardly as desired.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

That which is claimed is:

1. A remote radio unit (RRU) mounting assembly, the mounting assembly comprising:
a first clamp member having two first apertures therein;
a second clamp member having two second apertures therein;
first and second rods, wherein the first rod extends between one of the first apertures of the first clamp member and one of the second apertures of the second clamp member, and the second rod extends between another of the first apertures of the first clamp member and another of the second apertures of the second clamp member, the first and second rods interacting with the first and second clamp members to clamp into a mounting structure, the first and second rods being on opposite sides of the mounting structure;

a first mounting plate coupled directly to and extending outwardly from the first clamp member, the first mounting plate having a first plurality of apertures patterned for mounting a first RRU to the first mounting plate; and a second mounting plate coupled directly to and extending outwardly from the first clamp member and parallel to the first mounting plate, the second mounting plate having a second plurality of apertures patterned for mounting a second RRU to the second mounting plate, wherein the first mounting plate defines a first plane, and the second mounting plate defines a second plane, the first and second planes being parallel to an axis defined by the mounting structure and non-coplanar relative to each other.

2. The mounting assembly according to claim 1, wherein the first and second clamp members are secured to a mounting structure via the first and second rods and a securing component that engages each rod.

3. The mounting assembly according to claim 2, wherein the first and second rods are threaded rods, and the securing components are nuts.

4. The mounting assembly according to claim 1, wherein the first and second plurality of apertures are elongated slots, the elongated slots extending along a length of the first and second mounting plates, respectively, and in a first direction that is perpendicular to an axis defined by the mounting structure.

5. The mounting assembly according to claim 1, wherein the first mounting plate and the second mounting plate extend outwardly from the mounting structure in a first direction that is perpendicular to the axis defined by the mounting structure.

6. The mounting assembly according to claim 1, wherein the mounting structure is sandwiched between the pair of clamping members.

7. A remote radio unit (RRU) mounting assembly, the mounting assembly comprising:

a first mounting foundation comprising a first pair of clamping members configured to be secured to a mounting structure;

a first mounting plate coupled directly to and extending outwardly from the first mounting foundation in a first direction that is perpendicular to an axis of the mounting structure, the first mounting plate having a first plurality of apertures patterned for mounting a first RRU to the first mounting plate; and a second mounting plate coupled directly to and extending outwardly from the first mounting foundation in the first direction, and parallel to the first mounting plate, the second mounting plate having a second plurality of apertures patterned for mounting a second RRU to the second mounting plate;

a second mounting foundation comprising a second pair of clamping members configured to be secured to the mounting structure below the first mounting foundation;

a third mounting plate coupled to and extending outwardly from the second mounting foundation in the first direction, the third mounting plate having a third plurality of apertures patterned for mounting the first RRU to the third mounting plate; and a fourth mounting plate coupled to and extending outwardly from the second mounting foundation in the first direction, and parallel to the third mounting plate, the fourth mounting plate having a fourth plurality of apertures patterned for mounting the second RRU to the fourth mounting plate, wherein the first mounting plate defines a first plane, the second mounting plate defines a second plane, the third mounting plate defines a third plane, and the fourth mounting plate defines a fourth plane, the first, second, third, and fourth planes being parallel to an axis defined by the mounting structure, and wherein at least two of the first, second, third, and fourth planes are non-coplanar relative to each other.

8. The mounting assembly according to claim 7, wherein the first, second, third and fourth plurality of apertures are elongated slots, the elongated slots extending along a length of the first, second, third and fourth mounting plates, respectively, and in the first direction.

9. The mounting assembly according to claim 7, further comprising a first pair of rods extending between the first pair of clamping members, wherein the first pair of clamping members are secured to the mounting structure via the first pair of rods and a securing component that engages each rod.

10. The mounting assembly according to claim 7, wherein the first mounting plate is substantially identical to the third mounting plate, and wherein the second mounting plate is substantially identical to the fourth mounting plate.

* * * * *